(12) United States Patent
Fleischer et al.

(10) Patent No.: US 12,230,456 B2
(45) Date of Patent: Feb. 18, 2025

(54) COVERING FOR A SOLAR CELL WITH ELECTROCHROMIC FILTER

(71) Applicant: Siemens Energy Global GmbH & Co. KG, Bayern (DE)

(72) Inventors: Maximilian Fleischer, Hohenkirchen (DE); Roland Pohle, Herdweg (DE); Elfriede Simon, Munich (DE); Oliver von Sicard, Munich (DE)

(73) Assignee: Siemens Energy Global GmbH & Co. KG, Bayern (DE)

( * ) Notice: Subject to any disclaimer, the term of this patent is extended or adjusted under 35 U.S.C. 154(b) by 13 days.

(21) Appl. No.: 17/791,723

(22) PCT Filed: Jan. 11, 2021

(86) PCT No.: PCT/EP2021/050326
§ 371 (c)(1),
(2) Date: Jul. 8, 2022

(87) PCT Pub. No.: WO2021/151634
PCT Pub. Date: Aug. 5, 2021

(65) Prior Publication Data
US 2023/0031986 A1 Feb. 2, 2023

(30) Foreign Application Priority Data
Jan. 31, 2020 (EP) ..................... 20154804

(51) Int. Cl.
*H01G 9/20* (2006.01)
*G02F 1/153* (2006.01)
(Continued)

(52) U.S. Cl.
CPC ........... *H01G 9/209* (2013.01); *G02F 1/1533* (2013.01); *G02F 1/163* (2013.01); *H01G 9/2009* (2013.01);
(Continued)

(58) Field of Classification Search
CPC ........ H10K 30/88; H10K 30/87; H10K 30/57; H10K 30/30; G02F 1/163;
(Continued)

(56) References Cited

U.S. PATENT DOCUMENTS

2008/0245412 A1    10/2008 Uehlin
2009/0000221 A1*    1/2009 Jacobs .................... H02S 20/23
                                                               52/173.3
(Continued)

FOREIGN PATENT DOCUMENTS

DE    102005054365 A1    5/2007
DE    202009018167 U1    5/2011
(Continued)

OTHER PUBLICATIONS

DE202009018167U1 English machine translation (Year: 2011).*
(Continued)

*Primary Examiner* — Andrew J Golden
(74) *Attorney, Agent, or Firm* — Wolter Van Dyke Davis, PLLC

(57) ABSTRACT

An arrangement includes a solar cell and a covering, wherein the covering covers the solar cell, at least on the side that is intended to be exposed to electromagnetic radiation of the sun. The covering has an electrochromic layer. The arrangement also has a control unit for controlling the electrochromic layer. The control unit is designed to control the transmittance of the electrochromic layer for electromagnetic radiation in a defined wavelength range by applying an electrical voltage to the electrochromic layer.

17 Claims, 1 Drawing Sheet

(51) Int. Cl.
*G02F 1/163* (2006.01)
*H10K 30/30* (2023.01)
*H10K 30/57* (2023.01)
*H10K 30/87* (2023.01)
*H10K 30/88* (2023.01)

(52) U.S. Cl.
CPC ........... *H01G 9/2072* (2013.01); *H10K 30/30* (2023.02); *H10K 30/57* (2023.02); *H10K 30/87* (2023.02); *H10K 30/88* (2023.02); *G02F 2001/1536* (2013.01)

(58) Field of Classification Search
CPC ......... H01L 31/02167; H01L 31/02168; H01L 31/0725; H01L 31/076
See application file for complete search history.

(56) References Cited

U.S. PATENT DOCUMENTS

| | | | | |
|---|---|---|---|---|
| 2009/0038674 | A1* | 2/2009 | Bieber | H01L 31/0521 136/251 |
| 2011/0232745 | A1* | 9/2011 | Alves | H01L 31/02168 359/601 |
| 2013/0074926 | A1* | 3/2013 | Pei | H01L 31/02327 136/257 |
| 2018/0309077 | A1* | 10/2018 | Bush | H10K 30/20 |
| 2019/0386162 | A1* | 12/2019 | Hayashi | H01L 31/02164 |

FOREIGN PATENT DOCUMENTS

| | | | |
|---|---|---|---|
| KR | 20100138666 A | 12/2010 | |
| WO | WO-2015024045 A1 * | 2/2015 | ............ H02S 40/22 |
| WO | 2018132491 A1 | 7/2018 | |
| WO | 2020064344 A1 | 4/2020 | |

OTHER PUBLICATIONS

Solar Spectrum Solar Radiation and Irradiance Ossila <https://www.ossila.com/en-us/pages/the-solar-spectrum> (Year: 2020).*

Katayama et al, Degradation and fault diagnosis of photovoltaic cells using impedance spectroscopy, 2019, Solar Energy Materials and Solar Cells 194 130-136 (Year: 2019).*

Best Research—Cell Efficiency Chart; https://www.nrel.gov/pv/cell-efficiency.html.

Cojocaru, Ludmila et al., Temperature_Effects on the Photovoltaic Performance of Planar Structure Perovskite Solar Cells; https://www.researchgate.net/publication/282511262_Temperature_Effects_on_the_Photovoltaic_Performance_of_Planar_Structure_Perovskite_Solar_Cells; https://onlinelibrary.wiley.com/doi/abs/10.1002/cssc.201802899; 2015.

Sheikh, Arif D. et al.; Effects of High Temperature and Thermal Cycling on the Performance of Perovskite Solar Cells; Acceleration of Charge Recombination and Deterioration of Charge Extraction; ACS Appl. Mater. Interfaces 2017, 9, 40, 35018-35029; Publication Date:Sep. 18, 2017; https://doi.org/10.1021/acsami.7b11250; 2017.

PCT International Search Report and Written Opinion of International Searching Authority mailed Apr. 29, 2021 corresponding to PCT International Application No. PCT/E P2021 /050326 filed Jan. 11, 2021.

* cited by examiner

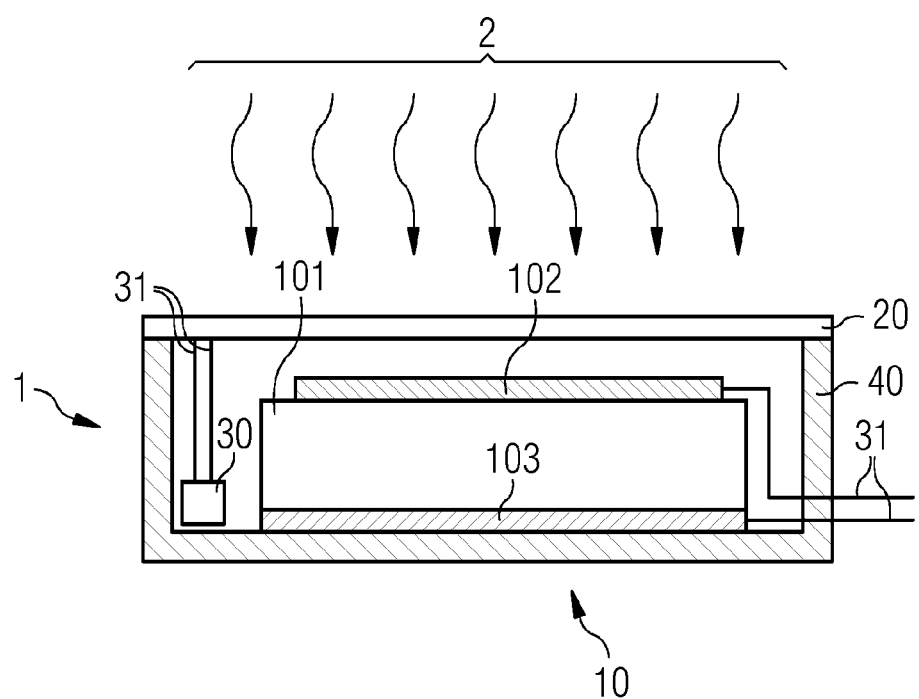

COVERING FOR A SOLAR CELL WITH ELECTROCHROMIC FILTER

CROSS REFERENCE TO RELATED APPLICATIONS

This application is the US National Stage of International Application No. PCT/EP2021/050326 filed 11 Jan. 2021, and claims the benefit thereof. The International Application claims the benefit of European Application No. EP20154804 filed 31 Jan. 2020. All of the applications are incorporated by reference herein in their entirety.

FIELD OF INVENTION

The invention relates to an arrangement comprising a solar cell, a cover having an electrochromic layer, and a control unit for controlling the electrochromic layer. The invention further relates to a method of operating such a solar cell.

BACKGROUND OF INVENTION

Perovskite solar cells or a new and promising in-layer technology for photovoltaics. Efficiencies exceeding 25% have already been demonstrated on a laboratory scale, which is approaching the record efficiencies of conventional multi- or monocrystalline silicon solar cells (23% and 26% respectively). For tandem solar cells consisting of a perovskite solar cell and a silicon solar cell, and efficiency of 28% has already been demonstrated on a laboratory scale.

The material of the perovskite structure has the general structure $ABX_3$. Photoactive material used is typically the basic form $(CH_3NH_3)PbX_3$. The photoactive material and the hole conductor layers that are currently in use have some challenges with regard to stability with respect to ultraviolet radiation (UV radiation), moisture resistance and thermal stability.

UV radiation, via photocatalytic effects of the materials incorporated in the solar cells (e.g. $TiO_2$) or through direct action of the UV radiation on the layers that occur (this particularly affects the organic constituents), can lead to damage to the cells and hence lowering of the efficiency.

Moreover, perovskite solar cells can be damaged at relatively high temperatures and/or the efficiency of the cells decreases significantly. This may be caused by phase transitions in the perovskite, by interdiffusion of layers which is enhanced at elevated temperatures, or by enhanced ion migration within the perovskite.

According to the exact composition of the perovskite (it is possible to replace particular components of the structure with other elements/compounds) and selection of the charge carrier conductor layers, the critical temperature for the perovskite solar cell at which the cell is damaged is different, but is typically in the range of 55° C. to 90° C.

It is therefore important to keep the temperature of a perovskite solar cell below this critical limit in order to prevent destruction of the perovskite solar cell and maintain high efficiency over a sustained period.

The main cause of the increase in temperature of the perovskite solar cells in a photovoltaic module is the solar incidence. Photons in the low-energy range (below the bandgap of the perovskite) cannot be utilized for charge carrier generation, but contribute to an increase in temperature of the cell. High-energy photons (above the bandgap) contribute to generation of electronic-hole pairs, but the energy remaining above that is released to the material via thermalization.

Against this background, it is an object of the invention to minimize the risk of overheating of a solar cell, especially a perovskite solar cell, with associated irreversible damage to the solar cell.

SUMMARY OF INVENTION

This object is achieved by an arrangement and an operating method according to the independent claims. Advantageous developments and embodiments are disclosed in the dependent claims, the description and the FIGURES.

Accordingly, an arrangement comprising a solar cell and a cover is proposed. The cover especially serves to protect the solar cell from weathering influences, for example soiling and hail. The cover covers the solar cell at least on that side which is intended for irradiation with electromagnetic radiation from the sun. According to the invention, the cover has an electrochromic layer. The arrangement also includes a control unit for control of the electrochromic layer. This control unit is configured to control the transmittance of the electrochromic layer for electromagnetic radiation in a defined wavelength range by application of an electrical voltage to the electrochromic layer.

The core of the invention is to avoid overheating of the solar cell by means of a "switchable optical filter" which is part of the cover of the solar cell. According to the invention, this switchable filter is implemented by means of an electrochromic layer in the cover. An electrochromic layer is understood to mean a layer having molecules or crystals, the optical properties of which change by virtue of an external electrical field or a flow of current. The change in optical properties is generally based on a change in electronic states in the molecules/crystals. Typically, strong electrochromic effects can be observed in some transition metal oxides (e.g. tungsten oxide), complexes (e.g. "Prussian blue") and in the case of some conductive polymers. In the case of conductive polymers, for example, the polymer skeleton can be reversibly electrochemical oxidized and reduced.

The present invention is employed in the case of what are called perovskite solar cells, i.e. solar cells wherein the absorber has a perovskite structure. This is because, in the case of perovskite solar cells—by contrast, for example, with conventional crystalline silicon solar cells—a significant drop in efficiency and damage to the solar cell which is irreversible under some circumstances are observed even in the case of relatively low cell temperatures in the region between 55° C. and 90° C. In this respect, it is of utmost significance particularly for perovskite solar cells to avoid overheating of the cell, especially of the absorber thereof that has the perovskite structure.

Furthermore, the present invention finds use in tandem solar cells, or generally in multiple solar cells. A tandem solar cell is understood to mean a composite composed of two solar cells made from different materials that are layered one on top of the other. The upper solar cell facing the light absorb is light with a comparatively short wavelength (meaning a high energy) and allows longer-wave light to pass through. Incident on the second solar cell beneath is that portion of the spectrum that has not already been absorbed by the upper solar cell. It is thus possible, in principle, to arrange any number of part-solar cells one on top of another. The purpose of this arrangement is to increase the efficiency of conversion of sunlight to electrical current compared to single solar cells. This is firstly achieved in that short-wave (high-energy) light generates a higher voltage in the uppermost part-solar cells. Secondly, the absorption in the longer-wave (low-energy) spectral region can be extended by part-solar cells disposed beneath. In a tandem solar cell, it is thus possible both to widen the absorption range compared to a single solar cell and to increase the efficiency of conversion in the short-wave spectral region. Novel tandem solar cells rely on the combination of a conventional silicon solar cell as lower solar cell and a perovskite solar cell as upper solar cell.

A challenge in the case of tandem solar cells is to achieve, as far as possible, a similarly large (or even essentially equal) current of the two-part-cells at the maximum Power point of tandem solar cell. This is referred to in the jargon as "current matching". The reason for this is that the current from the tandem solar cell is limited by the lower current of the two part-cells. Herein lies a specific advantage of the use of an electrochromic layer in a tandem solar cell: if the electrochromic layer is configured in such a way that it reduces or blocks a portion of the electromagnetic radiation in that part-cell having the higher current at the maximum power point of the tandem solar cell, this, under some circumstances, is not associated with any reduction at all in the overall efficiency of the tandem solar cell, but the heating in that part-cell with the higher current is reduced. In other words, the reduction in the radiation for one of the two solar cells is not even associated with a lower energy yield, but merely with a lower thermal stress-which means a benefit for the tandem solar cell overall.

Depending on the electrical field applied for the flow of current induced, the transmission of electromagnetic radiation through the electrochromic layer in a certain wavelength range is higher or lower. In other words, the transmittance of the cover, i.e. the optical permeability thereof, is controlled by means of the electrochromic layer present in the cover. According to the invention, this adjustment is controlled by a control device. Both discrete and infinite variation of the transmittance of the electrochromic layer is conceivable here.

In one embodiment of the invention, the control unit is configured such that it is capable of at least reducing, if not substantially suppressing, the transmittance of photons having an energy of more than a predetermined value above the activation energy of the solar cell.

The aim of this configuration is the reduction or suppression of high-energy photons, which is understood to mean photons having an energy greater than the bandgap of the solar cell used. Although these high high-energy photons contribute to generation of electron-hole pairs in the absorber of the solar cell, the energy remaining above that is released to the absorber or adjoining layers of the solar cell via thermalization. If the transmittance for high-energy photons is thus adjusted by means of the electrochromic layer in such a way that they are largely absorbed or reflected by the cover and hence do not reach the solar cell itself, there will be a drop in the generation of electron-hole pairs in the absorber of the solar cell, but heating of the solar cell will also be avoided. Under some circumstances, it may be advantageous to draw somewhat less electrical power from the solar cell, but on the other hand to reduce the risk of irreversible damage to solar cell on account of overheating.

Conversely, in another embodiment of the invention, the control unit is configured such that is capable at least of reducing, if not of essentially suppressing, the transmission of photons having an energy of more than a predetermined value below the activation energy of the solar cell.

This configuration is aimed at the reduction or suppression of low-energy photons, which is understood to mean photons having an energy of less than the bandgap of the solar cell. Photons in the low-energy range can be utilized for the generation of charge carriers, but contribute to an increase in temperature of the cell. Suppression or reduction of the transmission of photons having an energy below the bandgap of the solar cell generally seems to be advantageous.

The predetermined value above or below the activation energy of the solar cell may, for example, be 5%, 10%, 15%, 20%, 25% or 50% of the activation energy. If the activation energy of the solar cell is, for example, 1.11 eV, the predetermined value would thus be 0.056 eV, 0.111 eV, 0.167 eV. 0.222 eV or 0.555 eV. The transmission of photons having an energy of 0.056 eV. 0.111 eV, 0.167 eV, 0.222 eV or 0.555 eV above or below the activation energy (of 1.11 eV) would then be reduced by means of coverage with the electrochromic layer or even essentially completely suppressed.

The transmission of photons above or below the activation energy is considered to be "essentially" suppressed when not more than 10%, advantageously not more than 5%, most advantageously not more than 2%, of the photons having the energy specified pass through the electrochromic layer.

In a further embodiment of the invention, the control unit is configured such that it is capable of essentially suppressing any transmission of electromagnetic radiation from the sun through the electrochromic layer.

In this case, electromagnetic radiation of any wavelength that hits the cover as solar radiation would thus be absorbed or reflected thereby. Only an insignificant proportion, especially at most 10%, advantageously at most 5%, most advantageously at most 2%, of the incident photons would then be able to pass through the electrochromic layer and potentially be absorbed by the solar cell. To a certain degree, this variant is the most drastic application of the optical filter. But it may be advantageous in some states of operation, for example when the solar cell has already exceeded a temperature that is vital to its integrity, to completely shadow the solar cell and, on the other hand, to temporarily accept the loss of any electrically withdrawable power from the solar cell.

The control unit generally consumes electrical energy in order to be able to control the electrochromic layer and especially in order to achieve a change in the transmittance of the layer for certain wavelengths. It is often the case, however, that electrical energy is needed only for a change in transmittance, but not continuously for maintenance of a certain state of the electrochromic layer.

In any case, however, it is conceivable that the electrical energy required by the control unit is provided by the solar cell itself. Especially because it is necessary to change the state of the electrochromic layer particularly in the case of a threat of overheating of the solar cell, there is generally also sufficient electrical power that can partly be used specifically for the control of the electrochromic layer.

A photovoltaic module is typically constructed in such a way that the solar cells are embedded in a transparent polymer layer (ethylene-vinyl acetate (EVA) or silicone rubber). On that side of the solar cell intended for exposure to solar radiation, the polymer layer is typically adjoined by a glass pane. The glass pane thus covers the solar cell. The glass pane may lie directly atop the polymer layer. Alternatively, there may be further interlayers between the polymer layer and the glass panes, or there may deliberately be an empty space filled with air, vacuum or a gas, for example a noble gas. The glass pane used is usually a toughened safety glass (ESG) on the side facing the sun. A frame, for example an aluminum profile frame, completes the construction and serves for protection of the glass pane on transport, handling and assembly, and for the securing and for the bracing of the photovoltaic module.

According to the invention, the electrochromic layer is a portion of the cover. If the cover has a glass pane, the electrochromic layer may be mounted, for example, on one side of the glass pane. Alternatively, the electrochromic layer may already be incorporated within the glass pane. As a further variant in turn, two glass panes pressed together are also conceivable, with the electrochromic layer disposed between them.

As well as the arrangement comprising the solar cell, the cover with the electrochromic layer and the control unit for controlling the electrochromic layer, the invention also relates to a method of operating a solar cell. The solar cell here is protected by a cover, where the cover covers the solar cell at least on that side intended for irradiation with electromagnetic radiation from the sun. The cover has an electrochromic layer. The method comprises applying an electrical voltage to the electrochromic layer by means of a control unit in order to control the transmittance of the electrochromic layer for electromagnetic radiation within a defined wavelength range.

In one embodiment of the method of the invention, the temperature of the solar cell is ascertained in a preceding step. The transmittance is advantageously then controlled depending on the ascertained temperature of the solar cell.

The temperature of the solar cell can be ascertained, for example, by means of impedance spectroscopy, particularly when the solar cell is a solar cell having an absorber having a perovskite structure (such a solar cell is also referred to as perovskite solar cell). The way in which the temperature of a perovskite solar cell can be ascertained by means of impedance spectroscopy is described in detail, for example, in international patent application PCT/EP2019/074317.

In a further embodiment of the invention, the control unit uses artificial intelligence in order to ascertain an optimum for the establishment of the transmittance of the electrochromic layer for particular wavelength ranges of the incident electromagnetic radiation. The target parameter for the optimization is especially a greatest possible energy yield with conservation, i.e. no significant degradation, in the properties of the solar cell. Especially in the case of control of the transmission of high-energy photons, it is necessary to weigh up whether a higher energy yield resulting from greater generation of electron-hole pairs in the solar cell or a lower risk of (irreversible) damage to the solar cell material is chosen. For this purpose, a correspondingly taught neural network may be useful.

BRIEF DESCRIPTION OF THE DRAWING

The invention is illustrated in detail by the appended drawing.

The FIGURE shows:

FIG. 1: an arrangement comprising a solar cell, a cover with an electrochromic layer, and a control unit for controlling the electrochromic layer.

DETAILED DESCRIPTION OF THE INVENTION

FIG. 1 (also referred to as FIG. 1) shows a solar cell 10 with an absorber 101, a front-side contact 102 and a reverse-side contact 103. The solar cell 10 may, for example, be a perovskite solar cell. The absorber 101 for absorption of electromagnetic radiation from the sun (also referred to as "solar radiation") in this case has a perovskite structure having the general structural formula $ABX_3$. Specifically, for example, the material $(CH_3NH_3)PbI_3$ has been found to be a suitable photoactive material. The front-side contact 102 is designed for electromagnetic radiation from a particular wavelength range for which the solar cell is designed, advantageously transparent. The reverse-side contact 103 may be configured over the full area and in a non-transparent manner (for example comprising an aluminum alloy). The front-side contact 102 and reverse-side contact 103 are each connected by electrical conductors 31. If there are multiple solar cells in a photovoltaic module (which is likely to be the case in reality), these solar cells are interconnected by means of electrical conductors.

The solar cell 10 is within a housing. The housing has a frame 40. The frame 40 may consist essentially of aluminum profiles. The frame 40 in FIG. 1 constitutes the side walls of the housing. On that side of the housing intended to face the electromagnetic radiation 2 from the sun is a cover 20. The cover comprises a glass pane, especially toughened safety glass. If multiple solar cells are present in the housing, the cover advantageously covers all the solar cells present in the housing. An electrochromic layer is applied on the inside of the glass pane. The electrochromic layer covers the entirety of the region of the glass pane facing the solar cell 10. The electrochromic layer is connected by means of electrical conductors 31 to a control unit 30 positioned at the base of the housing. The control unit 30 is configured to control the transmittance of the electrochromic layer for electromagnetic radiation 2 with a defined wavelength range by application of an electrical voltage to the electrochromic layer.

Thus, the arrangement 1 comprising the solar cell 10, the cover 20 with the electrochromic layer and the control unit for control of the electrochromic layer contains a "switchable optical filter" that can specifically block or transmit photons from a particular wavelength range. By means of specific temporary adjustment of the transmittance of a particular wavelength range, it is thus possible to counteract overheating of the solar cell without having to accept greater losses in the energy yield of the solar cell than absolutely necessary.

LIST OF REFERENCE NUMERALS 1 arrangement
2 electromagnetic radiation
10 solar cell
101 absorber
102 front-side contact
103 reverse-side contact
20 cover
30 control unit
31 electrical conductor
40 frame

The invention claimed is:

1. An arrangement, comprising:
   a solar cell,
   a cover, wherein the cover covers the solar cell at least on that side intended for irradiation with electromagnetic radiation from the sun, wherein the cover has an electrochromic layer, and
   a control unit for control of the electrochromic layer, wherein the control unit is configured to control transmittance of the electrochromic layer for electromagnetic radiation in a defined wavelength range by application of an electrical voltage to the electrochromic layer such that a temperature of the solar cell is maintained below a temperature limit, wherein the solar cell includes an absorber for absorption of the electromagnetic radiation from the sun and the absorber has a perovskite structure, and wherein the arrangement has at least one further solar cell, and the solar cell and the at least one further solar cell form a tandem solar cell;

wherein the control unit is configured to at least one of:
  reduce or essentially suppress transmission of photons having an energy of more than a predetermined value above an activation energy of the solar cell and simultaneously facilitate transmission of photons having an energy within the activation energy of the solar cell, and
  reduce or essentially suppress transmission of photons having an energy of more than a predetermined value below an activation energy of the solar cell and simultaneously facilitate transmission of photons having an energy within the activation energy of the solar cell;

wherein the arrangement is configured to determine the temperature of the solar cell by impedance spectroscopy.

2. The arrangement as claimed in claim 1, wherein the activation energy of the solar cell is a bandgap of the solar cell;
wherein the control unit is configured to essentially suppress transmission of photons having the energy of more than the predetermined value above the bandgap of the solar cell;
wherein the control unit is configured to essentially suppress transmission of photons having the energy of more than the predetermined value below the bandgap of the solar cell;
wherein essentially suppress includes suppression of at least 90% of photon transmission;
and wherein the predetermined value is a percentage of the bandgap that is between 5% and 50%.

3. The arrangement as claimed in claim 1,
wherein the reduction or essential suppression by the control unit of photons having the energy of more than the predetermined value above the activation energy of the solar cell is configured to reduce a generation of electron-hole pairs in the absorber and reduce thermalization of the absorber due to a release of energy of the photons remaining above electron-hole pair generation in the absorber;
and wherein the reduction or essential suppression by the control unit of photons having the energy of less than the predetermined value below the activation energy of the solar cell is configured to reduce charge carrier generation in the absorber.

4. The arrangement as claimed in claim 1,
wherein the control unit is configured to essentially suppress any transmission of electromagnetic radiation from the sun through the electrochromic layer.

5. The arrangement as claimed in claim 1,
wherein the control unit is provided with electrical energy required for its operation by the solar cell.

6. The arrangement as claimed in claim 1,
wherein the cover comprises a glass pane.

7. The arrangement as claimed in claim 1,
wherein the arrangement further comprises a frame that surrounds the cover for reinforcement and bracing of the cover.

8. A method of operating the arrangement of claim 1, wherein the solar cell is protected by the cover, wherein the cover covers the solar cell at least on that side intended for irradiation with electromagnetic radiation from the sun, and wherein the cover has the electrochromic layer, the method comprising:
applying an electrical voltage to the electrochromic layer by a control unit in order to control transmittance of the electrochromic layer for electromagnetic radiation in a defined wavelength range such that a temperature of the solar cell is maintained below a temperature limit.

9. The method as claimed in claim 8, further comprising:
in a preceding step, ascertaining the temperature of the solar cell and controlling the transmittance depending on the ascertained temperature of the solar cell to maintain the ascertained temperature below the temperature limit.

10. The method as claimed in claim 9,
wherein the solar cell is a solar cell having an absorber having a perovskite structure, and the temperature of the solar cell is ascertained by impedance spectroscopy.

11. The arrangement as claimed in claim 6,
wherein the glass pane comprises a toughened safety glass.

12. The arrangement as claimed in claim 1, wherein the defined wavelength range is based on a wavelength corresponding to an activation energy of the solar cell.

13. The arrangement as claimed in claim 1, wherein the temperature limit is in a range from 55 degrees Celsius to 90 degrees Celsius.

14. An arrangement, comprising:
a solar cell,
a cover, wherein the cover covers the solar cell at least on that side intended for irradiation with electromagnetic radiation from the sun, wherein the cover has an electrochromic layer, and
a control unit for control of the electrochromic layer, wherein the control unit is configured to control transmittance of the electrochromic layer for electromagnetic radiation in a defined wavelength range by application of an electrical voltage to the electrochromic layer such that a temperature of the solar cell is maintained below a temperature limit,
wherein the solar cell includes an absorber for absorption of the electromagnetic radiation from the sun and the absorber has a perovskite structure, and
wherein the arrangement has at least one further solar cell, and the solar cell and the at least one further solar cell form a tandem solar cell;
wherein the control unit is configured to at least one of:
  reduce or essentially suppress transmission of photons having an energy of more than a predetermined value above an activation energy of the solar cell and simultaneously facilitate transmission of photons having an energy within the activation energy of the solar cell, and
reduce or essentially suppress transmission of photons having an energy of more than a predetermined value below an activation energy of the solar cell and simultaneously facilitate transmission of photons having an energy within the activation energy of the solar cell;
wherein the tandem solar cell comprises a first solar cell that is the solar cell and a second solar cell that is the at least one further solar cell that are layered on top of each other such that the first solar cell is facing the electromagnetic radiation from the sun and the second solar cell is positioned beneath the first solar cell and configured to receive electromagnetic radiation that has passed through the first solar cell;

wherein the first solar cell has a first current at a maximum power point of the tandem solar cell and wherein the second solar cell has a second current at the maximum power point of the tandem solar cell that is less than the first current;

wherein the cover is configured to reduce a portion of electromagnetic radiation incident on the first solar cell to reduce the first current of the first solar cell; and wherein the reduction of the first current of the first solar cell is not associated with a reduction in overall efficiency of the tandem solar cell.

15. The arrangement as claimed in claim 14, wherein the first solar cell is configured to absorb electromagnetic radiation with a first energy and wherein the second solar cell is configured to absorb electromagnetic radiation with a second energy that is less than the first energy;

wherein the cover is configured to reduce the first current of the solar cell at the maximum power point of the tandem solar cell to achieve current matching wherein the first current matches the second current at the maximum power point of the tandem solar cell.

16. An arrangement, comprising:

a solar cell, a cover, wherein the cover covers the solar cell at least on that side intended for irradiation with electromagnetic radiation from the sun, wherein the cover has an electrochromic layer, and a control unit for control of the electrochromic layer, wherein the control unit is configured to control transmittance of the electrochromic layer for electromagnetic radiation in a defined wavelength range by application of an electrical voltage to the electrochromic layer such that a temperature of the solar cell is maintained below a temperature limit, wherein the solar cell includes an absorber for absorption of the electromagnetic radiation from the sun and the absorber has a perovskite structure, wherein the arrangement includes a further solar cell wherein the solar cell and the further solar cell form a tandem solar cell, and wherein the cover is configured to reduce a portion of electromagnetic radiation incident on the solar cell to reduce a current of the solar cell such that the reduction of the current of the solar cell is not associated with a reduction in an overall efficiency of the tandem solar cell.

17. The arrangement as claimed in claim 16, wherein the control unit is configured to reduce or essentially suppress transmission of photons having an energy of more than a predetermined value above an activation energy of the solar cell and simultaneously facilitate transmission of photons having an energy within the activation energy of the solar cell;

wherein the control unit is configured to reduce or essentially suppress transmission of photons having an energy of more than a predetermined value below an activation energy of the solar cell and simultaneously facilitate transmission of photons having an energy within the activation energy of the solar cell; and wherein the defined wavelength range is based on a wavelength corresponding to the activation energy of the solar cell.

* * * * *